United States Patent
Niimura et al.

(10) Patent No.: US 11,726,895 B2
(45) Date of Patent: *Aug. 15, 2023

(54) SEMICONDUCTOR DEVICE

(71) Applicant: Kioxia Corporation, Tokyo (JP)

(72) Inventors: Masashi Niimura, Yokohama (JP); Kenshi Fukuda, Kamakura (JP)

(73) Assignee: Kioxia Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/843,500

(22) Filed: Jun. 17, 2022

(65) Prior Publication Data

US 2022/0318121 A1    Oct. 6, 2022

Related U.S. Application Data

(63) Continuation of application No. 16/807,266, filed on Mar. 3, 2020, now Pat. No. 11,392,478.

(30) Foreign Application Priority Data

Sep. 6, 2019 (JP) .................... 2019-163383

(51) Int. Cl.
*G11C 29/02*    (2006.01)
*G06F 11/34*    (2006.01)
(Continued)

(52) U.S. Cl.
CPC .. *G06F 11/3419* (2013.01); *G01R 31/318371* (2013.01); *G06F 1/08* (2013.01);
(Continued)

(58) Field of Classification Search
CPC .... G06F 11/3419; G06F 1/08; G06F 11/3037; G06F 11/3055; G11C 16/08;
(Continued)

(56) References Cited

U.S. PATENT DOCUMENTS 8,283,663 B2    10/2012 Kobayashi
11,392,478 B2 *  7/2022 Niimura ......... G01R 31/318371
(Continued)

FOREIGN PATENT DOCUMENTS

JP    61-181975 A    8/1986
JP    2006-268935 A    10/2006
JP    5000900 B2    8/2012

*Primary Examiner* — Jay W. Radke
(74) *Attorney, Agent, or Firm* — Oblon, McClelland, Maier & Neustadt, L.L.P.

(57) ABSTRACT

A semiconductor device capable of monitoring a connection state of a terminal on a semiconductor chip includes a selector configured to acquire terminal levels of a plurality of respective terminals on the semiconductor chip to which an inspection pattern is inputted based on a detection signal, a memory configured to store latch data based on a chip address which identifies the semiconductor chip and a plurality of the terminal levels corresponding to the plurality of terminals based on the detection signal, an output circuit configured to read a plurality of pieces of latch data from the memory based on the detection signal and to output the plurality of pieces of latch data, and a timing control circuit configured to generate the detection signal by detecting an edge of a clock inputted during an inspection mode and configured to activate the selector, the memory, and the output circuit.

15 Claims, 6 Drawing Sheets

(51) Int. Cl.
  *G11C 16/26* (2006.01)
  *G06F 1/08* (2006.01)
  *G11C 16/32* (2006.01)
  *G06F 11/30* (2006.01)
  *G11C 16/08* (2006.01)
  *G01R 31/3183* (2006.01)
  *G11C 29/54* (2006.01)

(52) U.S. Cl.
  CPC .......... *G06F 11/3037* (2013.01); *G11C 16/08* (2013.01); *G11C 16/26* (2013.01); *G11C 16/32* (2013.01); *G11C 29/022* (2013.01); *G11C 29/025* (2013.01); *G11C 29/54* (2013.01)

(58) Field of Classification Search
  CPC ......... G11C 16/26; G11C 16/32; G11C 29/10; G11C 29/12015; G11C 29/14; G11C 29/32; G11C 29/1201; G11C 2029/3202; G11C 29/022; G11C 29/025; G11C 29/54; G01R 31/318371
  See application file for complete search history.

(56) References Cited

U.S. PATENT DOCUMENTS

| | | |
|---|---|---|
| 2003/0197515 A1 | 10/2003 | Ishigaki |
| 2006/0232292 A1 | 10/2006 | Shimizume |
| 2007/0220389 A1* | 9/2007 | Sato ................. G01R 31/31919 714/733 |
| 2007/0250744 A1 | 10/2007 | Nguyen |
| 2011/0115468 A1* | 5/2011 | Kantake ................. G11C 29/56 324/76.77 |
| 2014/0003170 A1 | 1/2014 | Ku |
| 2016/0187421 A1 | 6/2016 | Oshiyama |

* cited by examiner

FIG. 5

| | CADD(b) | CADD(a) | /RE | RE | WE | ALE | CLE | LE | LATCH DATA |
|---|---|---|---|---|---|---|---|---|---|
| | | HIGH-ORDER BIT → | | | | | ← LOW-ORDER BIT | | |
| CHIP (0, 0) | 0 | 0 | 0 | 0 | 0 | 0 | 0 | 1 | 01h |
| | 0 | 0 | 0 | 0 | 0 | 0 | 1 | 0 | 02h |
| | 0 | 0 | 0 | 0 | 0 | 1 | 0 | 0 | 04h |
| | 0 | 0 | 0 | 0 | 1 | 0 | 0 | 0 | 08h |
| | 0 | 0 | 0 | 1 | 0 | 0 | 0 | 0 | 10h |
| | 0 | 0 | 1 | 0 | 0 | 0 | 0 | 0 | 20h |
| CHIP (0, 1) | 1 | 0 | 0 | 0 | 0 | 0 | 0 | 1 | 81h |
| | 1 | 0 | 0 | 0 | 0 | 0 | 1 | 0 | 82h |
| | 1 | 0 | 0 | 0 | 0 | 1 | 0 | 0 | 84h |
| | 1 | 0 | 0 | 0 | 1 | 0 | 0 | 0 | 88h |
| | 1 | 0 | 0 | 1 | 0 | 0 | 0 | 0 | 90h |
| | 1 | 0 | 1 | 0 | 0 | 0 | 0 | 0 | A0h |

SEMICONDUCTOR DEVICE

CROSS-REFERENCE TO RELATED APPLICATION

This application is a continuation of U.S. application Ser. No. 16/807,266 filed Mar. 3, 2020 and which is based upon and claims the benefit of priority from the prior Japanese Patent Application No. 2019-163383 filed in Japan on Sep. 6, 2019; the entire contents of each of which are incorporated herein by reference.

FIELD

An embodiment described herein relates generally to a semiconductor device.

BACKGROUND

In general, with respect to semiconductor chips sealed in a package, a connection state inspection for detecting a normal state or a defective state relating to connection such as short-circuiting of various terminals (pins), a bonding failure, or a disconnection is performed by making use of external terminals of the package.

For example, when NAND memory chips each forming a single body are sealed in a package, a connection state inspection of the NAND memory chip is performed by connecting a tester to an external terminals of the package to which various terminals such as control terminals and I/O terminals of the NAND memory chip are connected.

However, in the structure where a plurality of single-body of NAND memory chips are disposed in a package in a stacked manner, terminals having the same function of the respective NAND memory chips may be connected in common in the form of links, and be connected to an external terminal of the package. In this case, it is difficult to determine in which NAND memory chip a connection failure has occurred.

Further, there may be a case where a NAND memory chip on which a controller is mounted is sealed in a package. In such a configuration, a connection portion between the controller and the NAND memory chip is sealed in the chip and hence, it is difficult to perform a connection state inspection of the various terminals of the NAND memory chip.

BRIEF DESCRIPTION OF THE DRAWINGS

FIG. 5 is a chart showing latch data stored in a FIFO 43, that is, expectation values in a case where a connection failure does not occur in terminals.

DETAILED DESCRIPTION

Hereinafter, an embodiment of a present invention is described in detail with reference to drawings.

In this embodiment, a memory for storing values of respective terminals (pins) and values which identify semiconductor chips is provided, a connection state inspection circuit which outputs the values stored in the memory from I/O terminals is provided, and a connection state can be determined by comparing expectation values corresponding to values given to the respective terminals with outputs of the I/O terminals by activating the connection state inspection circuit with a supply of a clock.

In this embodiment, the description is made by taking a NAND flash memory which is a non-volatile semiconductor memory device as an example. However, the present invention is not limited to the inspection of connection state of terminals of a memory device, and is applicable to the inspection of a connection state of terminals of various semiconductor devices.

(Configuration of Memory System)

Figure 1:
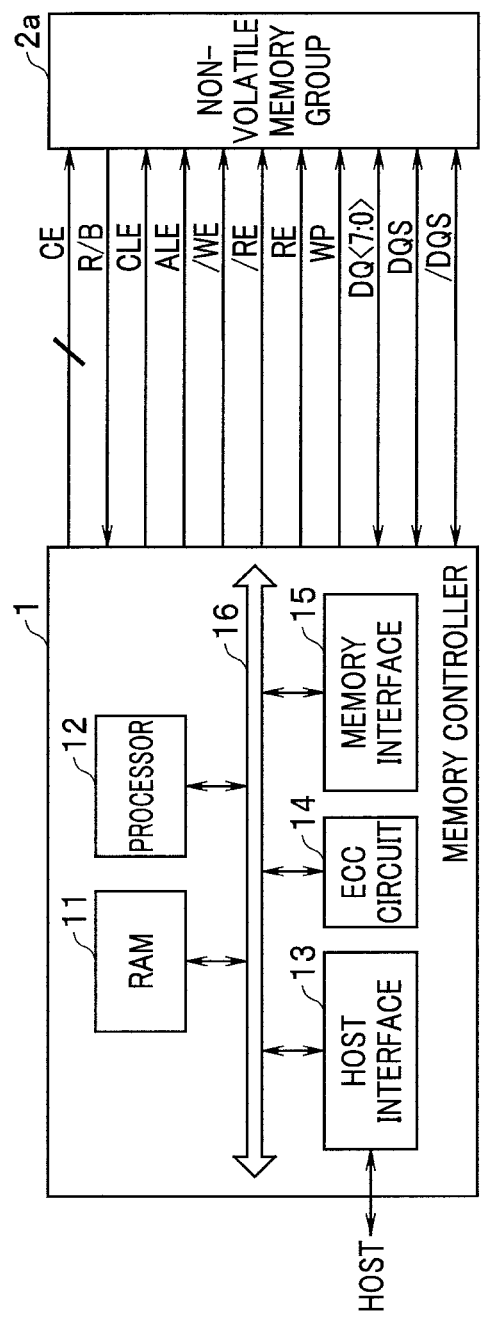
FIG. 1 is a block diagram showing a configuration example of a memory system including a non-volatile memory chip which is an object to be inspected.

FIG. 1 is a block diagram showing a configuration example of a memory system including a non-volatile memory chip which is an object to be inspected. The memory system according to this embodiment includes a memory controller 1 and a non-volatile memory group 2a. The memory system is connectable with a host. The host is electronic equipment such as a personal computer, or a mobile terminal.

The non-volatile memory group 2a is a semiconductor memory device which stores data in a non-volatile manner. The non-volatile memory group 2a includes a plurality of non-volatile memory chips 2 such as NAND flush memories (see FIG. 2). The non-volatile memory group 2a may be formed by stacking the plurality of non-volatile memory chips 2.

The memory controller 1 controls writing of data to the non-volatile memory group 2a in accordance with a write request from the host. The memory controller 1 also controls reading of data from the non-volatile memory group 2a in accordance with a read request from the host. The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to each other by an internal bus 16.

The host interface 13 outputs a request received from the host, write data which is user data and the like to the internal bus 16. The host interface 13 transmits user data read from the non-volatile memory group 2a, a response from the processor 12 and the like to the host.

The memory interface 15 controls processing for writing user data and the like to the non-volatile memory group 2a and processing for reading user data and the like from the non-volatile memory group 2a in accordance with a command from the processor 12.

The processor 12 controls the memory controller 1 in a comprehensive manner. The processor 12 is, for example, a central processing unit (CPU) or a micro processing unit (MPU). When the processor 12 receives a request from the host via the host interface 13, the processor 12 performs a control in accordance with the request. For example, the processor 12 instructs, in accordance with a request from the host, the memory interface 15 to perform writing of user data and parity into the non-volatile memory group 2a. The processor 12 also instructs, in accordance with a request from the host, the memory interface 15 to read user data and parity from the non-volatile memory group 2a.

The processor 12 determines a storage region on the non-volatile memory group 2a (hereinafter referred to as a memory region) with respect to user data stored in the RAM 11. User data is stored in the RAM 11 via the internal bus 16. The processor 12 makes the decision of the memory region with respect to data per page which is a writing unit, that is, page data.

The processor 12 determines memory regions on the respective non-volatile memory chips 2 of the non-volatile memory group 2*a* which are writing destinations. Physical addresses are allocated to the memory regions of the non-volatile memory chips 2. The processor 12 controls the memory regions which are writing destinations of data using the physical addresses. The processor 12 designates the physical addresses of the decided memory region, and instructs the memory interface 15 to write user data in the non-volatile memory chip 2. The processor 12 controls the correspondence between a logical address (a logical address which the host controls) and the physical address of user data. When the processor 12 receives a read request containing a logical address from the host, the processor 12 identifies a physical address corresponding to the logical address, and instructs the memory interface 15 to read user data by designating the physical address.

The ECC circuit 14 generates a code word by encoding user data stored in the RAM 11. The ECC circuit 14 also decodes the code word read from the non-volatile memory group 2*a*.

The RAM 11 temporarily stores user data received from the host until the user data is stored in the non-volatile memory group 2*a*, or temporarily stores data read from the non-volatile memory group 2*a* until the data is transmitted to the host. The RAM 11 is a general-purpose memory such as a static random access memory (SRAM) or a dynamic random access memory (DRAM).

FIG. 1 shows the configuration example where the memory controller 1 includes the ECC circuit 14 and the memory interface 15 respectively. However, the ECC circuit 14 may be incorporated in the memory interface 15. The ECC circuit 14 may be incorporated in the non-volatile memory group 2*a*.

When the memory controller 1 receives a write request from the host, the memory controller 1 preforms the following operations. The processor 12 instructs the RAM 11 to temporality store write data. The processor 12 reads data stored in the RAM 11, and inputs the data to the ECC circuit 14. The ECC circuit 14 encodes inputted data, and gives the code word to the memory interface 15. The memory interface 15 writes inputted code word in the non-volatile memory group 2*a*.

When the memory controller 1 receives a read request from the host, the memory controller 1 performs the following operations. The memory interface 15 gives the code word read from the non-volatile memory group 2*a* to the ECC circuit 14. The ECC circuit 14 decodes the inputted code word, and stores the decoded data in the RAM 11. The processor 12 transmits data stored in the RAM 11 to the host via the host interface 13.

(Configuration of Non-Volatile Memory)

Figure 2:
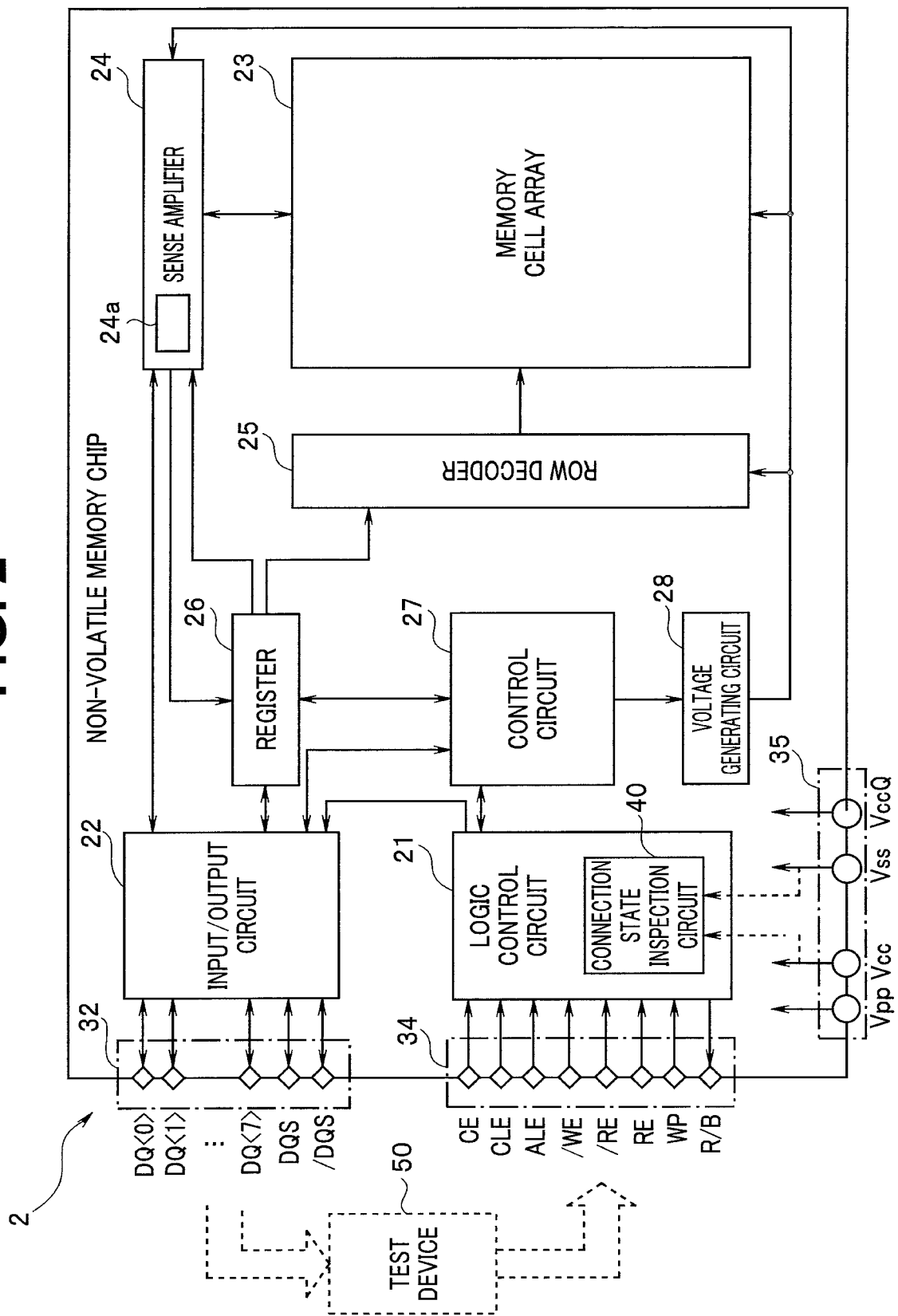
FIG. 2 is a block diagram showing a configuration example of a non-volatile memory chip 2.

FIG. 2 is a block diagram showing configuration example of the non-volatile memory chip 2. The non-volatile memory chip 2 includes a logic control circuit 21, an input/output circuit 22, a memory cell array 23, a sense amplifier 24, a row decoder 25, a register 26, a control circuit 27, a voltage generating circuit 28, an input/output pad group 32, a logic control pad group 34, and a power source input terminal group 35.

The memory cell array 23 includes a plurality of blocks. Each of the plurality of blocks includes a plurality of memory cell transistors. The memory cell transistor is formed of an electrically rewritable memory cell. A plurality of a bit lines, a plurality of word lines, a source line and the like are disposed in the memory cell array 23 for controlling voltage applied to the memory cell transistors.

The input/output pad group 32 includes a plurality of terminals (pads) which correspond to signals DQ<7:0> and data strobe signals DQS, /DQS for performing transmission and reception of respective signals containing data between the input/output pad group 32 and the memory controller 1.

The logic control pad group 34 includes a plurality of terminals (pads) which correspond to a chip enable signal CE, a command latch enable signal CLE, an address latch enable signal ALE, a write enable signal /WE, read enable signals RE and /RE, and a write protect signal WP for performing transmission and reception of respective signals between the logic control pad group 34 and the memory controller 1.

The signal CE enables the selection of the non-volatile memory chip 2. The signal CLE enables latching of a command transmitted as a signal DQ in a command register. The signal ALE enables latching of an address transmitted as a signal DQ in an address register. The signal WE enables writing. The signal RE enables reading. The write protect signal WP is a signal which inhibits writing and erasing. The write protect signal WP is a signal which is fixed to a high level (hereinafter, refer to as an H level) or a low level (hereinafter, referred to as an L level) in a normal in-use state.

A signal R/B indicates whether the non-volatile memory chip 2 is in a ready state (a state where the non-volatile memory chip 2 can receive a command from the outside) or in a busy state (a state where the non-volatile memory chip 2 cannot receive a command from the outside). The memory controller 1 can acquire a state of the non-volatile memory chip 2 by receiving the signal R/B.

The power source input terminal group 35 includes a plurality of terminals to which the power source voltages Vcc, VccQ, Vpp, and a ground voltage Vss are inputted for supplying various operation power sources to the non-volatile memory chip 2 from the outside. The power source voltage Vcc is a circuit power source voltage which is supplied from the outside in general as an operation power source. For example, a voltage of approximately 3.3 V is inputted. As the power source voltage VccQ, a voltage of 1.2 V, for example, is inputted. The power source voltage VccQ is used at the time of performing transmission or reception of a signal between the memory controller 1 and the non-volatile memory chip 2. The power source voltage Vpp is a power source voltage higher than the power source voltage Vcc, and a voltage of 12 V, for example, is inputted.

The logic control circuit 21 and the input/output circuit 22 are connected to a memory controller 1. Signals DQ (for example, DQ0 to DQ7) are transmitted and received between input/output circuit 22 and the memory controller 1. The logic control circuit 21 receives external control signals (for example, a chip enable signal CE, a command latch enable signal CLE, an address latch enable signal ALE, a write enable signal /WE, read enable signals RE and /RE, and a write protect signal WP) from the memory controller 1. A sign "/" added to the name of the signal indicates active low. The logic control circuit 21 transmits a ready/busy signal R/B to the memory controller 1.

The register 26 includes a command register, an address register, a status register and the like. The command registrar temporarily holds a command. The address register temporarily holds an address. The status register temporarily holds data necessary for an operation of the non-volatile memory chip 2. The register 26 is formed of an SRAM, for example.

The control circuit 27 receives a command from the register 26, and controls the non-volatile memory chip 2 in accordance with a sequence based on the command.

The voltage generating circuit 28 receives a power source voltage from the outside of the non-volatile memory chip 2, and generates a plurality of voltages necessary for a write operation, a read operation, and erase operation using such a power source voltage. The voltage generating circuit 28 supplies the generated voltages to the memory cell array 23, the sense amplifier 24, the row decoder 25 and the like.

The row decoder 25 receives a row address from the register 26, and decodes the row address. The row decoder 25 performs an operation of selecting the word line based on the decoded row address. Then, the row decoder 25 transfers a plurality of voltages necessary for a write operation, a read operation, and an erase operation to the selected block.

The sense amplifier 24 receives a column address from the register 26, and decodes the column address. The sense amplifier 24 selects any one of bit lines based on decoded column address. At the time of reading data, the sense amplifier 24 detects and amplifies data read from the memory cell transistor to the bit line. At a time of writing data, the sense amplifier 24 transfers write data to the bit line.

The sense amplifier 24 includes a data register 24a. At the time of reading data, the data register 24a temporarily holds data detected by the sense amplifier 24, and serially transfers the data to the input/output circuit 22. At the time of writing data, the data register 24a temporarily holds data transferred from the input/output circuit 22 in series, and transfers the data to the sense amplifier 24. The data register 24a is formed of an SRAM or the like.

In this embodiment, for example, the inspection pattern described later is supplied to the respective terminals or the like of the logic control pad group 34 by a test device 50.

Note that the memory controller 1 and the non-volatile memory group 2a may be sealed in the same package or may be sealed in packages different from each other. When the memory controller 1 and the non-volatile memory group 2a are sealed in the packages different from each other, the respective terminals of the input/output pad group 32 and the logic control pad group 34 are connected to external terminals of the packages to which the terminals of the test device 50 are connectable. In a case where the memory controller 1 and the non-volatile memory group 2a are sealed in a same package, the respective terminals which correspond to the input/output pad group 32 and the logic control pad group 34 shown in FIG. 2 are disposed on a memory controller 1 side, and are connected to the external terminals of the package to which the terminals of the test device 50 are connectable. In both cases, signals can be transmitted and received between the respective terminals of the test device 50 and the respective terminals of the input/output pad group 32 and the logic control pad group 34.

(Connection State Inspection Circuit)

In this embodiment, the logic control circuit 21 includes a connection state inspection circuit 40. The connection state inspection circuit 40, for inspecting connection states of the respective terminals of the non-volatile memory chips 2, monitors connection states of terminals which are objects to be inspected, and outputs a monitored result.

In FIG. 2, an example is described where the logic control circuit 21 includes the connection state inspection circuit 40, and the connection state inspection circuit 40 monitors the respective terminals of the logic control pad group 34. However, a configuration may be adopted where outputs of respective terminals of the input/output pad group 32 are given to the connection state inspection circuit 40, the connection state inspection circuit 40 may monitor connection states of the respective terminals of the input/output pad group 32, and may output a monitored result. Note that it is possible to determine whether a connection state of each terminal of the input/output pad group 32 is normal or defective depending on whether or not an output is at an H level or at an L level.

Figure 3:
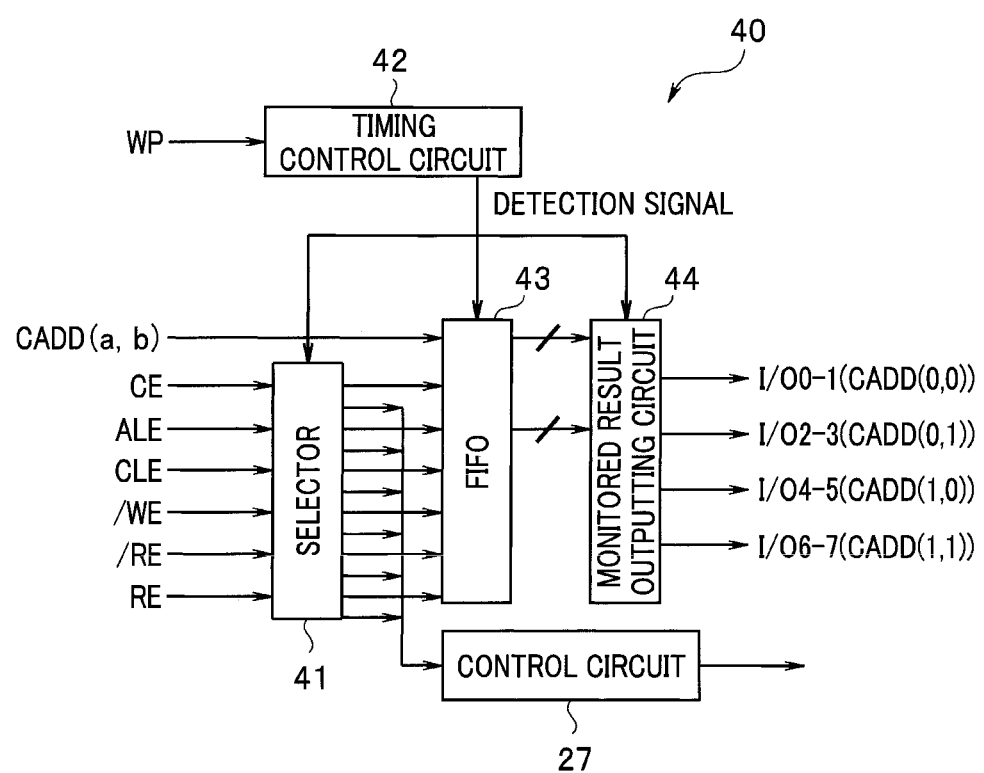
FIG. 3 is a block diagram showing one example of specific configuration of a connection state inspection circuit 40.

FIG. 3 is a block diagram showing one example of the specific configuration of the connection state inspection circuit 40. The connection state inspection circuit 40 is formed of a selector 41, a timing control circuit 42, a FIFO 43, and a monitored result outputting circuit 44.

The selector 41 is connected to the terminals which are objects to be inspected in a connection state, and fetches signals from the terminals which are the objects to be inspected. Note that an example is shown in FIG. 3 where the selector 41 fetches signals from the terminals to which a chip enable signal CE, an address latch enable signal ALE, a command latch enable signal CLE, a write enable signal /WE, a read enable signal RE or /RE are inputted (hereinafter these terminals being referred to as a CE terminal, an ALE terminal, a CLE terminal, a /WE terminal, a RE terminal, and a /RE terminal) among the respective terminals of the non-volatile memory chip 2. However, a configuration may be adopted where a connection state is monitored by fetching signals from other terminals.

A signal from a terminal to which a write protect signal WP in the logic control pad group 34 is inputted (hereinafter referred to as a WP terminal) is given to the timing control circuit 42. Such a signal is hereinafter referred to as a signal WP. The timing control circuit 42 is configured to detect an edge of the inputted signal WP and to output a detection signal for controlling the selector 41, the FIFO 43, and a monitored result outputting circuit 44 at edge detection timing.

A write protect signal WP is fixed at an H level or at an L level in a normal in-use state. Accordingly, in a normal in-use state, a signal at a fixed level is inputted to the timing control circuit 42, and an edge is not detected. In this embodiment, in an inspection mode where an inspection of a connection state of the terminals is performed, a clock is generated as a signal WP and is supplied to the timing control circuit 42.

Accordingly, in the inspection mode, the timing control circuit 42 detects an edge of a clock, and gives a detection signal to the selector 41, the FIFO 43, and the monitored result outputting circuit 44. When a detection signal is given from the timing control circuit 42, the selector 41, the FIFO 43, and the monitored result outputting circuit 44 are activated as circuits which perform the inspection mode.

In other words, in a normal in-use state of the non-volatile memory chip 2, a detection signal is not given to the selector 41 from the timing control circuit 42, and the inputted signals are directly outputted to the control circuit 27. On the other hand, when the detection signal is given to the selector 41 from the timing control circuit 42, the selector 41 fetches signals inputted via the respective terminals at input timing of the detection signal, and outputs the signals to the FIFO 43.

The FIFO 43 is a first-in first-out memory, and is a memory device which stores inputted data and outputs the stored data in the order of inputting. Note that a memory other than a first-in first-out memory may be adopted as such a memory device. A chip address CADD is also inputted to the FIFO 43. The chip address CADD is set to a value which identify each non-volatile memory chip 2. The connection state inspection circuit 40 generates, for example, a chip address CADD unique to its own chip using a power source voltage Vcc and a ground voltage Vss of the power source input terminal group 35, and gives the chip address CADD to the FIFO 43. For example, when the total number of the non-volatile memory chip 2 is four, the respective non-volatile memory chips 2 can be identified by the chip address CADD of two bits. FIG. 3 shows an example of this case where CADD(a, b) is configured such that a high-order bit of the chip address CADD is b (CADD(b)) and a low-order bit of the chip address CADD is a (CADD(a)).

Note that the chip address CADD is set to the number of bits which corresponds to the number of the non-volatile memory chips 2 forming the non-volatile memory group 2a. For example, when the number of non-volatile memory chips 2 is eight, the chip address CADD of three bits is used.

The FIFO 43 has a memory capacity capable of holding a plurality of pieces of data on the number of bits which is a sum of the number of terminals which are the objects to be inspected of the selector 41 and the number of bits of the chip address CADD. In this embodiment, in the inspection mode, data of an H level or an L level, that is, a logic value "1" or "0" is inputted to the terminals which are the objects to be inspected. The FIFO 43 sets respective data which correspond to the respective terminals from the selector 41 as low-order bits and the bits from the chip address CADD as high-order bits, and holds data formed of these bits as latch data. In the example shown in FIG. 3, the latch data is data of eight bits which is a sum of six bits based on data of the respective terminals which are the objects to be inspected and two bits of the chip address CADD.

Inspection patterns to be supplied to the respective terminals which are the objects to be inspected change at a cycle of a signal WP, and change by the number of patterns corresponding to the number of terminals which are the objects to be inspected. Latch data is sequentially stored in the FIFO 43 for respective patterns of the inspection pattern. In other words, as many pieces of latch data as the number of terminals which are the objects to be inspected are stored.

Writing of data into FIFO 43 and reading of data from the FIFO 43 are controlled by the timing control circuit 42. The timing control circuit 42 performs a control of writing outputs of the selector 41 and the chip address CADD into the FIFO 43 based on a detection signal from starting of the inspection pattern to the completion of the inspection pattern, and a control of outputting a plurality of pieces of latch data held by the FIFO 43 to the monitored result outputting circuit 44 based on a detection signal after completion of the inspection pattern.

The FIFO 43 holds latch data in all inspection patterns based on a detection signal, and after the completion of the inspection patterns, sequentially outputs latch data held based on the detection signal to the monitored result outputting circuit 44 in order of writing of the latch data.

The monitored result outputting circuit 44 allocates the respective bits of the latch data from the FIFO 43 to the respective I/O terminals to which signals DQ0 to DQ7 are respectively inputted (hereinafter referred to as I/O0 to I/O7 terminals), and outputs the latch data to the allocated I/O terminals as a monitored result based on a detection signal from the timing control circuit 42. In this embodiment, the monitored result outputting circuit 44 determines which I/O terminal the latch data is outputted to among the I/O0 to I/O7 terminals based on a chip address CADD in the latch data.

For example, in FIG. 3, the number of I/O terminals is eight and the number of non-volatile memory chips 2 is four and hence, a monitored result can be outputted using two I/O terminals per one chip. For example, in FIG. 3, the monitored result outputting circuit 44 in the non-volatile memory chip 2 where a chip address CADD is CADD(0, 0) outputs a monitored result to the I/O0 terminal and the I/O1 terminal. The monitored result outputting circuit 44 in the non-volatile memory chip 2 where a chip address CADD is CADD(0, 1) outputs a monitored result to the I/O2 terminal and the I/O3 terminal. The monitored result outputting circuit 44 in the non-volatile memory chip 2 where a chip address CADD is CADD(1, 0) outputs a monitored result to the I/O4 terminal and the I/O5 terminal. The monitored result outputting circuit 44 in the non-volatile memory chip 2 where a chip address CADD is CADD(1, 1) outputs a monitored result to the I/O6 terminal and the I/O7 terminal.

For example, when the number of patterns of the inspection pattern is six, in each non-volatile memory chip 2, latch data of eight bits is stored in FIFO 43 six times at the time of completion of an inspection pattern. A monitored result of each non-volatile memory chip 2 is outputted using two I/O terminals and hence, one latch data can be outputted by performing such outputting four times with two bits per one time and hence, six latch data can be outputted by performing such outputting by a sum of 24 times which is obtained by 4×6.

For example, an inspection pattern is supplied to the CE terminal, the ALE terminal, the CLE terminal, the /WE terminal, the RE terminal, and the /RE terminal by the test device 50, and a monitored result is outputted from the I/O0 terminal to the I/O7 terminal and is fetched by the test device 50. In all non-volatile memory chips 2, when all terminals which are the objects to be inspected are normal, a monitored result having an expectation value which corresponds to an inspection pattern is obtained from the I/O0 terminal to the I/O7 terminal. On the other hand, when a connection failure occurs in the terminals which are the objects to be inspected of any one of the non-volatile memory chips 2, a monitored result from the I/O terminals which correspond to such a non-volatile memory chip 2 differs from the expectation value. Further, with suitable setting of the inspection pattern, it is possible to determine which terminal a connection failure occurs in each non-volatile memory chip 2 by comparing a monitored result and an expectation value.

Note that the number of times necessary for outputting a monitored result is described as an example, and a product of the number of terminals which are the objects to be inspected, the number of bits of latch data based on the number of bits of the chip address CADD, and the number of inspection patterns is a total data amount of a monitored result which each non-volatile memory chip 2 outputs, and the number of times that the monitored result can be outputted is decided based on the total data amount and the number of chips and the number of I/O terminals of the non-volatile memory chip 2 in the non-volatile memory group 2a.

Further, the manner of forming latch data based on an output of the selector 41 and the chip address CADD is not limited to the above-mentioned example. For example, the chip address CADD may be arranged on a low-order bit side of latch data and the output of the selector 41 may be arranged on a high-order bit side of latch data. Further, the number of inspection patterns is not limited to one kind, and suitable inspection patters can be set.

Figure 4:
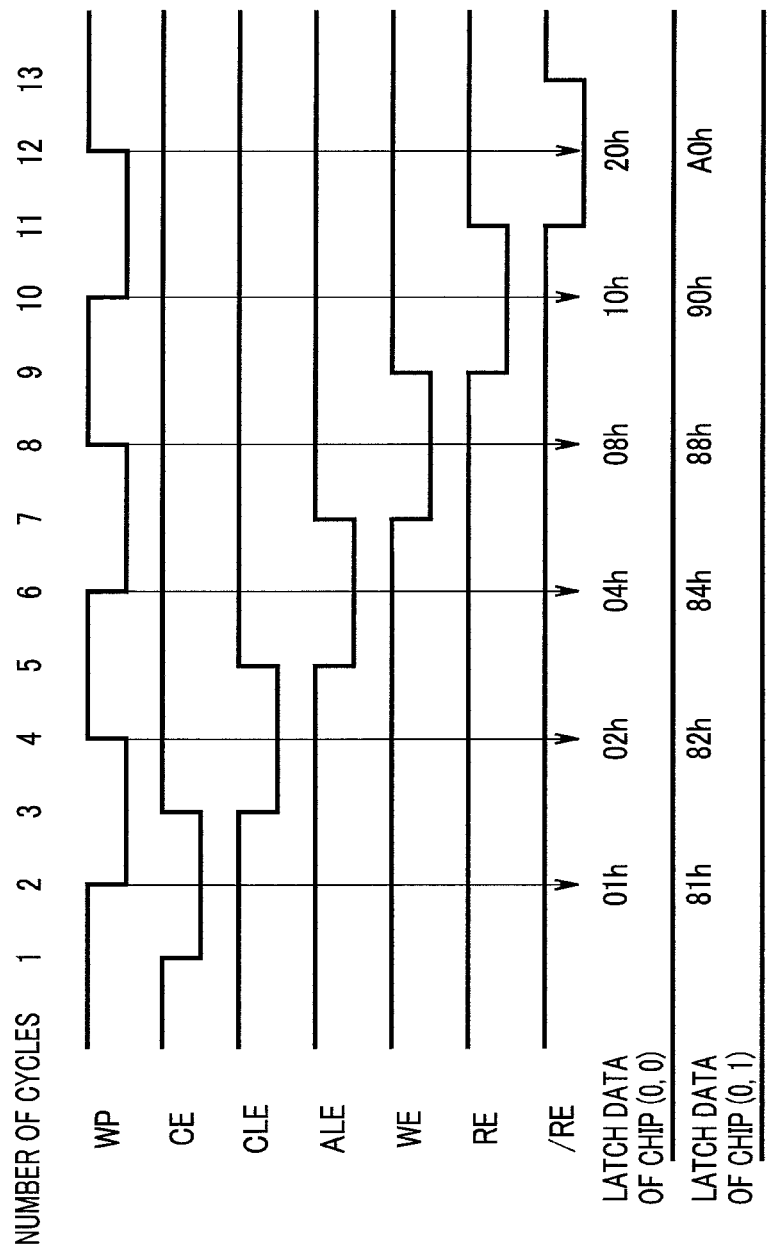
FIG. 4 is an explanatory diagram showing one example of a specific inspection pattern.
Figure 6:
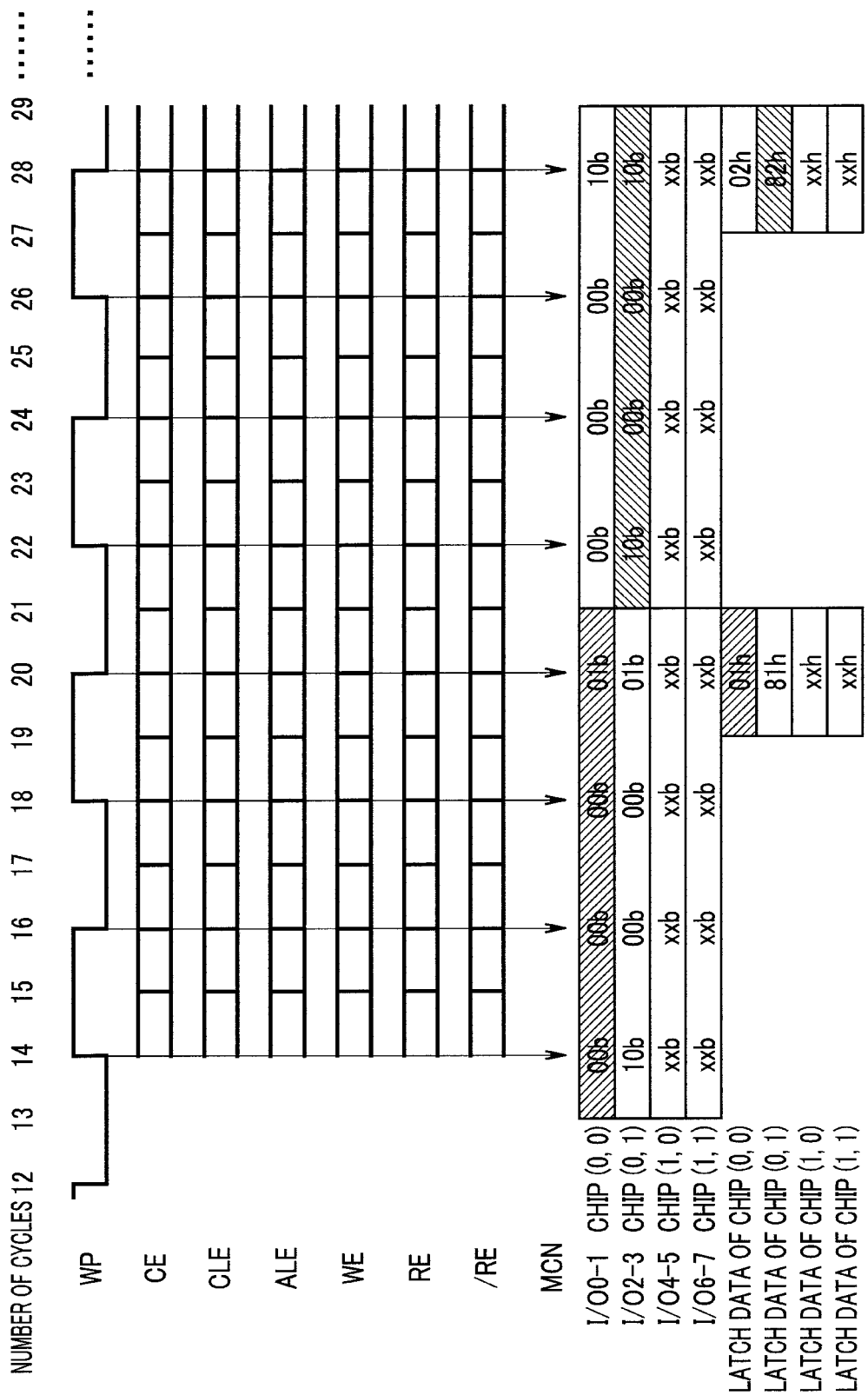
FIG. 6 is an explanatory diagram showing one example of outputting a monitored result.

Next, the manner of operation of the semiconductor device of the present invention having such a configuration is described with reference to FIG. 4 to FIG. 6. FIG. 4 is an explanatory diagram showing one example of a specific inspection pattern, FIG. 5 is a chart showing latch data stored in the FIFO 43, that is, expectation values in a case where a connection failure does not occur in terminals, and FIG. 6 is an explanatory diagram showing one example of outputting a monitored result.

In a normal in-use state, a write protect signal WP inputted to the WP terminal is fixed to an H level or an L level, and the timing control circuit 42 does not output a detection signal. The selector 41 outputs signals inputted to the selector 41 via the respective terminals of the logic control pad group 34 to the control circuit 27.

In an inspection mode, a clock of a predetermined cycle is supplied to the WP terminal by a test device 50 as a signal WP in place of a write protect signal WP. The timing control circuit 42 generates a detection signal at detection timing of an edge of the clock, and gives the detection signal to the selector 41, the FIFO 43, and the monitored result outputting circuit 44. With the supply of the detection signal, the selector 41, the FIFO 43, and the monitored result outputting circuit 44 are activated as circuits for performing a mode of inspecting a connection failure of the terminal.

In such a state, a predetermined inspection pattern is given to terminals which are objects to be inspected by the test device 50. As shown in FIG. 4, the inspection pattern synchronizes with the signal WP, and gives a signal which brings only one of the terminals which are the objects to be inspected at an edge of the signal WP at an L level. In the example shown in FIG. 4, the signal WP has an edge at timings of the number of cycles 2, 4, 6, . . . , and the CE, terminal, the CLE terminal, the ALE terminal, the WE terminal, the RE terminal, and the /RE terminal are at an L level at timings of the number of cycles 2, 4, 6, 8, 10, 12.

The example shown in FIG. 4 is an example of a case where a connection failure does not occur in the terminals which are the objects to be inspected. In a case where a connection failure occurs, it is considered that the terminal having a connection failure is fixed at an H level or at an L level regardless of the inspection pattern.

The selector 41 outputs data which corresponds to a level of an inspection pattern which appears on a terminal which is an object to be inspected to the FIFO 43 at timing of receiving a detection signal from the timing control circuit 42. A chip address CADD is also given to FIFO 43. The FIFO 43 holds latch data formed of a bit which corresponds to an H level or an L level which appears on the terminal which is the object to be inspected and a bit of a chip address CADD. Note that in FIG. 4, the bit which corresponds to the H level which appears on the terminal which is the object to be inspected is set as "0", and the bit which corresponds to the L level which appears on the terminal which is the object to be inspected as "1".

For example, in FIG. 4, the bit of a CE terminal is set as the lowest-order bit. The bit of a CLE terminal, the bit of an ALE terminal, the bit of a WE terminal, the bit of an RE terminal, the bit of a /RE terminal, and the bit of CADD (a) are arranged sequentially toward a higher order side. The bit of CADD (b) is set as the highest-order bit. To express the non-volatile memory chip 2 where chip address CADD is CADD (a, b) as a chip (a, b), in the FIFO 43 of the chip (0, 0), latch data of eight bits held at timing of the number of cycles 2 becomes "10000000"=01h. Further, for example, in the FIFO 43 of the chip (0, 0), latch data of eight bits held at timing of the number of cycles 4 becomes "01000000"=02h.

FIG. 5 shows expectation values of latch data in a case where the inspection pattern shown in FIG. 4 is inputted in a state where a connection failure does not occur on the terminal which is the object to be inspected. Note that in FIG. 5, only the chip (0, 0) and the chip (0, 1) are shown. However, substantially the same expectation values of latch data can be obtained also with respect to the chip (1, 0) and the chip (1, 1) except that the chip (1, 0) and the chip (1, 1) differ from the chip (0, 0) and the chip (0, 1) only with respect to CADD (a) and CADD (b).

In the example shown in FIG. 4, the number of terminals which are the objects to be inspected is six. At the number of cycles 12 where the detection signal is outputted six times, latch data with respect to all terminals which are objects to be inspected of all non-volatile memory chips 2 are held by the FIFOs 43 of the respective non-volatile memory chips 2.

These latch data are outputted via I/O terminals at timing of the number of cycles 14 in FIG. 6, for example. In the example shown in FIG. 6, the chip (0, 0) outputs latch data via an I/O0 terminal and the I/O1 terminal. The chip (0, 1) outputs latch data via an I/O2 terminal and an I/O3 terminal. The chip (1, 0) outputs latch data via an I/O4 terminal and an I/O5 terminal. The chip (1, 1) outputs latch data via an I/O6 terminal and an I/O7 terminal.

In the example shown in FIG. 6, out of two I/O terminals which output latch data of eight bits, one I/O terminal sequentially outputs respective bits consisting of a first bit, a third bit, a fifth bit, and a seventh bit from a high-order bit for every cycle, and the other I/O terminal sequentially outputs respective bits consisting of a second bit, a fourth bit, a sixth bit, and an eighth bit from the high-order bit for every cycle. Note that in FIG. 6, the bits of two I/O terminals outputted at timing of the same number of cycles from the FIFO 43 of the same chip are indicated by xxb.

For example, assuming that latch data (01h) which are exactly expectation values shown in FIG. 5 are stored in the FIFO 43 of the chip (0, 0), as indicated by hatched portions shown in FIG. 6, at the number of cycles 14, "0" which is the highest-order bit is outputted from an I/O0 terminal, and "0" of the second bit is outputted from the I/O1 terminal. Next, at the number of cycles 16, "0" of the third bit is outputted from the I/O0 terminal, and "0" of the fourth bit is outputted from the I/O1 terminal. Next, at the number of cycles 18, "0" of the fifth bit is outputted from the I/O0 terminal, and "0" of the sixth bit is outputted from the I/O1 terminal. Next, at the number of cycles 20, "0" of the seventh bit is outputted from the I/O0 terminal, and "1" of the lowest-order bit is outputted from the I/O1 terminal.

In the same manner, for example, with respect to latch data (81h) of the chip (0, 1) acquired at the number of cycles 2 in FIG. 4, using the I/O2 terminal and the I/O3 terminal, "1" of the highest-order bit and "0" of the second bit are outputted at the number of cycles 14, "0" of the third bit and the "0" of the fourth bit are outputted at the number of cycles 16, "0" of the fifth bit and the "0" of the sixth bit are outputted at the number of cycles 18, and "0" of the seventh bit and "1" of the lowest-order bit are outputted at the number of cycles 20.

Substantially the same operation is performed also with respect to other chips. Latch data of the respective non-volatile memory chips 2 acquired at the number of cycles 2 are respectively outputted using two I/O terminals at the number of cycles 14, 16, 18, and 20.

In the same manner, latch data of the respective non-volatile memory chips 2 acquired at the number of cycles 4 in FIG. 4 are respectively outputted using two I/O terminals at the number of cycles 22, 24, 26, and 28. For example, with respect to latch data (82h) of the chip (0, 1) indicated by hatched portion in FIG. 6, "1" of the highest-order bit is outputted from the I/O2 terminal and "0" of the second bit is outputted from the I/O3 terminal at the number of cycles 22. Next, "0" of the third bit is outputted from the I/O2 terminal and "0" of the fourth bit is outputted from the I/O3 terminal at the number of cycles 24. Next, "0" of the fifth bit is outputted from the I/O2 terminal and the "0" of the sixth bit is outputted from the I/O3 terminal at the number of cycles 26. Next, "1" of the seventh bit is outputted from the I/O2 terminal and "0" of the lowest-order bit is outputted from the I/O3 terminal at the number of cycles 28.

In the same manner, latch data stored in the FIFOs 43 of the respective non-volatile memory chips 2 at the number of cycles 6 in FIG. 4 are respectively outputted using two I/O terminals at the number of cycles 30, 32, 34, and 36. Latch data stored in the FIFOs 43 of the respective non-volatile memory chips 2 at the number of cycles 8 in FIG. 4 are respectively outputted using two I/O terminals at the number of cycles 38, 40, 42, and 44. Latch data stored in the FIFOs 43 of the respective non-volatile memory chips 2 at the number of cycles 10 in FIG. 4 are respectively outputted using two I/O terminals at the number of cycles 46, 48, 50, and 52. Latch data stored in the FIFOs 43 of the respective non-volatile memory chips 2 at the number of cycles 12 in FIG. 4 are respectively outputted using two I/O terminals at the number of cycles 54, 56, 58, and 60.

A case is exemplified where latch data are outputted by giving the respective bits to two I/O terminals in an alternately switching manner from the high-order bit to the low-order bit of the latch data. However, other outputting method may be adopted. For example, four high-order bits of latch data are outputted from one I/O terminal out of two I/O terminals, and four low-order bits of latch data may be outputted from the other I/O terminal.

Outputs of the respective I/O terminals are detected by the test device 50. Then, a connection failure of each terminal which is an object to be detected is determined for every non-volatile memory chip 2 by comparing an output value of each I/O terminal and an expectation value. For example, when outputs of the I/O2 terminal and the I/O3 terminal agree with expectation values of the chip (0, 1) shown in FIG. 5, it is reasonable to determine that the connection of all terminals which are objects to be detected of the non-volatile memory chip 2 of the chip (0, 1) is normal. In this manner, whether the terminals are normal or defective can be determined for every non-volatile memory chip 2 by comparing outputs of the I/O terminals corresponding to the non-volatile memory chip 2 with expectation values.

For example, assume that a failure occurs in the CLE terminal of the chip (0, 0). In this case, irrespective of an inspection pattern, it is considered that the CLE terminal takes an H level or an L level over the entire period. For example, assuming that the CLE terminal is fixed to the H level, at the number of cycles 4, latch data stored in the FIFO 43 of the chip (0, 0) becomes "00000000"=00h. Accordingly, latch data of 01h, 00h, 04h, 08h, 10h, and 20h are stored in the FIFO 43 of the chip (0, 0). In this case, in the example shown in FIG. 6, an output of the I/O0 terminal at the number of cycles 28 becomes "0". If the CLE terminal is in a normal state, as shown in FIG. 6, an output of the I/O0 terminal at the number of cycles 28 is an expectation value "1". The test device 50 can detect the occurrence of a defect in the CLE terminal of the chip (0, 0) by monitoring the I/O terminal.

In this manner, this embodiment provides the connection state inspection circuit which has the memory configured to store values of respective terminals and values for identifying the semiconductor chip, and outputs the values stored in the memory from the I/O terminals. The connection state inspection circuit outputs an output corresponding to an inspection pattern given to each terminal and the value which identifies the semiconductor chip from the I/O terminal. By comparing an expectation value corresponding to the inspection pattern given to each terminal and the output of the I/O terminal, the connection state of each terminal for every semiconductor chip can be determined by the test device. Accordingly, even in the case where a plurality of semiconductor chips are stacked and the terminals of the respective semiconductor chips are connected in common, it is possible to determine a connection state of the terminals with certainty. Further, the connection state inspection circuit is configured to be activated by supplying a clock to a pulled-up or pulled-down terminal in a normal in-use state and hence, it is unnecessary to give a command or the like whereby a connection state can be accurately determined with an extremely simple configuration.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device configured to monitor a connection state of a first plurality of terminals on a semiconductor chip, the semiconductor device comprising:
    a first circuit configured to acquire, based on a detection signal, logic levels of the first plurality of terminals to which an inspection pattern is inputted;
    a second circuit configured to store, based on the detection signal, data comprising: an address which identifies the semiconductor chip; and the logic levels corresponding to the inspection pattern;
    a third circuit configured to read, based on the detection signal, a part of the data from the second circuit and to output the part of the data to a second plurality of terminals on the semiconductor chip; and
    a fourth circuit configured to generate the detection signal and to activate the first circuit, the second circuit, and the third circuit.

2. The semiconductor device according to claim 1, wherein the data is latch data comprising a plurality of bits corresponding to the address and a plurality of bits corresponding to the logic levels.

3. The semiconductor device according to claim 2, wherein a number of bits of the latch data is a sum of a number of bits corresponding to the address and a number of the first plurality of terminals.

4. The semiconductor device according to claim 1, wherein the second circuit is an FIFO memory.

5. The semiconductor device according to claim 1, wherein the second plurality of terminals are input and output terminals on the semiconductor chip.

6. The semiconductor device according to claim 5, wherein the third circuit is configured to sequentially output the data stored in the second circuit after all the data is stored in the second circuit.

7. The semiconductor device according to claim 1, wherein the third circuit is configured to output, based on the address in the data, the data from at least one terminal of the second plurality of terminals.

8. The semiconductor device according to claim 1,
wherein the semiconductor device is configured to operate in an inspection mode that monitors the connection state of the first plurality of terminals on the semiconductor chip, and
wherein the fourth circuit is configured to generate the detection signal in the inspection mode.

9. The semiconductor device according to claim 8, wherein the fourth circuit is configured to generate the detection signal by detecting an edge of a clock inputted during the inspection mode.

10. The semiconductor device according to claim 9, wherein the fourth circuit is configured to fetch the clock via a terminal fixed to a high level or a low level except for during the inspection mode.

11. The semiconductor device according to claim 1, wherein when the detection signal is inputted to the first circuit from the fourth circuit, the first circuit is configured to acquire the logic levels of the first plurality of terminals based on a cycle of the detection signal.

12. The semiconductor device according to claim 1, further comprising:
an inspection mode configured to monitor the connection state of the first plurality of terminals on the semiconductor chip,
wherein the first circuit is configured to output signals inputted to the first circuit to a control circuit configured to control the semiconductor chip, except for during the inspection mode.

13. The semiconductor device according to claim 1, wherein a number of patterns of the inspection pattern corresponds to a number of the first plurality of terminals.

14. An inspection device comprising:
the semiconductor device according to claim 12; and
a fifth circuit configured to supply the inspection pattern to the first plurality of terminals and to receive input of the part of the data from the second plurality of terminals.

15. The inspection device according to claim 14, wherein the fifth circuit is configured to determine the connection state of the first plurality of terminals based on the part of the data inputted from the second plurality of terminals and on an expectation value based on the inspection pattern.

* * * * *